(12) United States Patent
Chang et al.

(10) Patent No.: US 7,247,915 B2
(45) Date of Patent: Jul. 24, 2007

(54) COBALT/NICKEL BI-LAYER SILICIDE PROCESS FOR VERY NARROW LINE POLYSILICON GATE TECHNOLOGY

(75) Inventors: Chih-Wei Chang, Hsiu-Chu (TW); Mei-Yun Wang, Hsin-Chu (TW); Shau-Lin Shue, Hsinchu (TW); Mong-Song Liang, Hsin-Chu (TW)

(73) Assignee: Taiwan Semiconductor Manufacturing Company (TW)

(*) Notice: Subject to any disclaimer, the term of this patent is extended or adjusted under 35 U.S.C. 154(b) by 0 days.

(21) Appl. No.: 11/375,778

(22) Filed: Mar. 15, 2006

(65) Prior Publication Data

US 2006/0157800 A1 Jul. 20, 2006

Related U.S. Application Data

(62) Division of application No. 10/607,496, filed on Jun. 26, 2003, now Pat. No. 7,105,439.

(51) Int. Cl.
  *H01L 29/76* (2006.01)
  *H01L 29/94* (2006.01)
  *H01L 31/062* (2006.01)

(52) U.S. Cl. ................. 257/382; 257/377; 257/E29.156

(58) Field of Classification Search ................. 257/757, 257/377, 382, 384, 388, 412, 413, 456, 486, 257/576, 574, 755, 768, E29.156, E29.161
See application file for complete search history.

(56) References Cited

U.S. PATENT DOCUMENTS

| | | | |
|---|---|---|---|
| 5,047,367 A | 9/1991 | Wei et al. | 437/200 |
| 5,818,092 A | 10/1998 | Bai et al. | 257/388 |
| 5,922,516 A | 7/1999 | Yu et al. | 430/314 |
| 6,121,138 A | 9/2000 | Wieczorek et al. | 438/682 |
| 6,265,271 B1 | 7/2001 | Thei et al. | 438/296 |
| 6,387,767 B1 | 5/2002 | Besser et al. | 438/305 |
| 6,399,494 B1 | 6/2002 | Nagata | 438/682 |
| 6,509,265 B1 | 1/2003 | DeHaven et al. | 438/685 |
| 6,534,871 B2 | 3/2003 | Maa et al. | 257/769 |
| 6,541,866 B1 * | 4/2003 | Bertrand et al. | 257/766 |

OTHER PUBLICATIONS

Mo et al.["Formation and properties of ternary silicide (CoxNi1–x)Si2 thin films", Solid-State and Integrated Circuit Technology, 1998, Proceedings 1998 5th International Conference, pp. 271-274].*

Wang et al. ["Novel Co/Ni Bi-layer Salicidation for 45 nm Gate Technology", Symposium on VLSI Technology Digest of Technical Paper, Jun. 10-12, 2003, pp. 157-158].*

* cited by examiner

*Primary Examiner*—Thanhha S. Pham
(74) *Attorney, Agent, or Firm*—Duane Morrris, LLP

(57) ABSTRACT

A silicide method for integrated circuit and semiconductor device fabrication wherein a layer of nickel is formed over at least one silicon region of a substrate and a layer of cobalt is formed over the nickel layer. The cobalt/nickel bi-layer is then annealed to transform the bi-layer to a bi-silicide film having a cobalt-rich silicide portion and a nickel-rich silicide portion.

1 Claim, 10 Drawing Sheets

Rs comparison of pure NiSi and Ni/Co
bilayer silcide on blanket wafers

| Test Condition | Silicide Rs (Relative value) |
| --- | --- |
| Control (Nisi only) | R |
| Co/Ni with lower RTA | 1.7R |
| Co/Ni with thicker Co | 1.1R |
| Co/Ni with optimized Co thickness and RTA | 0.9R |

TEM and EDX analysis for optimized
Co/Ni bilayer silicide process

| Site | Co/Ni atomic ratio |
|------|--------------------|
| A    | 1.9                |
| B    | 0.5                |
| C    | 0.07               |

Auger depth profile of Co/Ni bilayer silicide
post salicide formation

Comparison of Chemical resistance for Co, Ni and metal silicides

| Film type | Rs variation % ( post 10 min chemical solution attack ) | | |
|---|---|---|---|
| | $H_2SO_4$ | $H_3PO_4$ | HCl |
| Co | > 1000 | > 1000 | > 1000 |
| Ni | > 1000 | > 1000 | > 1000 |
| CoSix | < 5 | < 5 | < 5 |
| NiSi | < 5 | < 5 | < 5 |
| CoNiSix | < 5 | < 5 | < 5 |

Rs variation % = (Rs post etching-Rs pre etching)/ Rs pre etching * 100%

TEM and diffraction pattern analysis for pure NiSi layer under contact hole with conventional backend process of $CoSi_2$ (10A) Sheet resistance (10B) junction leakage current of P+/NW (10C) isolation current of N+ gate to source/drain for pure Ni salicide (♦) and Co/Ni bilayer (■) salicide processes

COBALT/NICKEL BI-LAYER SILICIDE PROCESS FOR VERY NARROW LINE POLYSILICON GATE TECHNOLOGY

RELATED APPLICATIONS

This application is a divisional of application Ser. No. 10/607,496, filed Jun. 26, 2003 now U.S. Pat. No. 7,105,439. The entire disclosure of application Ser. No. 10/607,496 is incorporated herein by reference.

FIELD OF THE INVENTION

This invention relates to integrated circuit and semiconductor device fabrication and, more particularly, to a cobalt/nickel bi-layer silicide process which utilizes a cobalt/nickel stack to create a bi-silicide $CoNiSi_x$ film that provides better chemical and plasma resistance than pure nickel silicide.

BACKGROUND OF THE INVENTION

Self-aligned silicide (salicide) technology is required in modem integrated circuit and semiconductor device fabrication to lower the resistance of polysilicon gates, sources and drains to reduce RC delay, i.e., the gate speed performance index wherein less delay produces increased gate speed performance. On example of a well known silicide technology is cobalt silicide ($CoSi_2$). $CoSi_2$ process are commonly used for sub quarter micron and beyond technology. Unfortunately, the agglomeration effect of $CoSi_2$ on very narrow line polysilicon gates that are less than 65 nanometers, often limits its extendibility to the fabrication of shorter gates.

Nickel silicide (NiSi) technology appears to be emerging as a dominant solution to very narrow line polysilicon gates because it provides better sheet resistance (Rs) for narrow line polysilicon gates, less junction leakage, less silicon (Si) consumption, and can even improve the drive current (Idsat) of an NFET or PFET.

With respect to the NiSi, there are still some concerns about monosilicide phase stability, film thermal stability, and plasma damage resistance of NiSi while implementing this process.

Accordingly, a method or process is needed which allows NiSi to be implemented successfully in very narrow line polysilicon gate technology.

SUMMARY OF THE INVENTION

A first aspect of the invention is a silicide method for integrated circuit and semiconductor device fabrication. The method comprises: forming a layer of nickel over at least one silicon region of a substrate; forming a layer of cobalt over the nickel layer to form a cobalt/nickel bi-layer; and annealing the cobalt/nickel bi-layer to transform the bi-layer to a bi-silicide film including a cobalt-rich silicide portion and a nickel-rich silicide portion.

A second aspect of the invention is a method for fabricating a semiconductor device. The method comprises: forming a gate of the semiconductor device over a substrate; forming a layer of nickel over the gate; forming a layer of cobalt over the nickel layer to form a cobalt/nickel bi-layer; and annealing the cobalt/nickel bi-layer to transform the bi-layer to a bi-silicide film including a cobalt-rich silicide portion and a nickel-rich silicide portion.

A third aspect of the invention is a bi-silicide film. The film comprises: a cobalt-rich portion; and a nickel-rich portion.

A fourth aspect of the invention is a semiconductor device. The device comprises: a gate; source/drains regions formed on opposite sides of the gate; and a bi-silicide film formed over the gate and the source/drain regions, the bi-silicide film including a cobalt-rich portion and a nickel-rich portion.

DETAILED DESCRIPTION OF THE INVENTION

The invention relates to a cobalt/nickel bi-layer silicide (salicide) process for 90 nanometer gate technology (and down to 20 nanometer gate technology) that combines the advantages of both cobalt salicide and nickel salicide, to provide low gate sheet resistance, low silicon (Si) consumption, and high plasma resistance. The bi-layer process of the invention is designed so that the top Co-rich silicide ($CoSi_x$) portion of the resulting bi-silicide film $CoNiSi_x$ is the thinner and operative as a protection layer, and the bottom portion (which is close to pure NiSi) of the $CoNiSi_x$ silicide film is thicker with a low resistance and operative as main gate and source/drain conductive material. Although this process is especially suited for 90 nanometer gate technology, it is contemplated that the invention will be useful down to 20 nanometers and below.

Figure 1A:
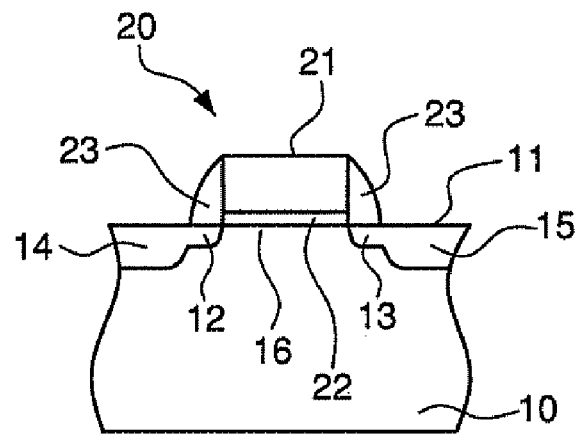
FIGS. 1A-1H are sectional views showing the steps of the cobalt/nickel bi-layer silicide process of the invention.

Referring now to FIG. 1A, there is shown a sectional view of a semiconductor transistor 20. The transistor 20 is formed on a semiconductor substrate 10, composed, for example, from monocrystalline silicon. The transistor 20 comprises a gate 21 which may be conventionally formed, for example, from a conductive polycrystalline silicon (polysilicon) material which is dielectrically spaced above the substrate 10 by a gate oxide film 22 conventionally formed over a first surface 11 of the substrate 10. A spacer 23 extends laterally outward from each of the sidewall surfaces of the gate 21. The spacers 23 may be conventionally formed, for example, from a nitride material. The substrate 10 includes an active region which receives dopants that are self-aligned to the sidewall surfaces of the gate 21 and the spacers 23. The dopants are those which comprise the source/drain dopants as well as the LDD dopants. More specifically, the active region may include lightly doped source 12 and drain 13 regions which are self-aligned to the sidewalls of the gate 21, and heavily doped source 14 and drain 15 regions which are self-aligned to the sidewalls of the spacers 23. The lightly doped source 12 and drain 13 regions and the heavily doped source 14 and drain 15 regions may be formed in the substrate 10 using conventional methods. A channel 16 region exists between the lightly doped source 12 and drain 13 regions.

The process of the invention commences with a pre-salicidation native oxide removal step. Native oxide removal may be accomplished by dipping the substrate 10 of FIG. 1 in an etchant, such as hydrofluoric acid. The etchant removes any native oxide ($SiO_2$) on the silicon surfaces of the substrate 10.

Figure 1B:
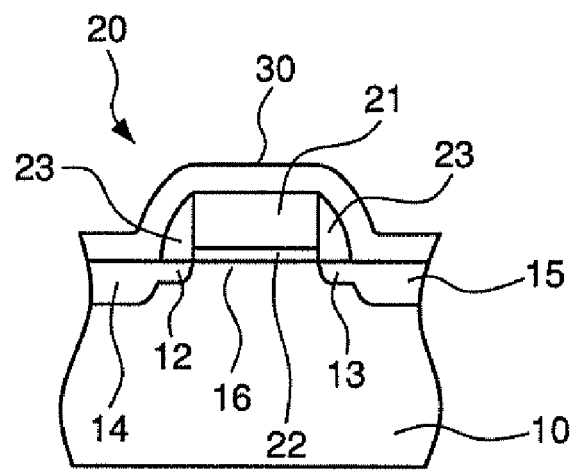

In FIG. 1B, a layer 30 of nickel (Ni) is conformally formed over the substrate 10. The Ni layer 30 can be formed, for example, using any conventional metal deposition technique, such as sputtering. The Ni layer 30 is typically deposited to a thickness of between about 10 and 20 nanometers.

Figure 1C:
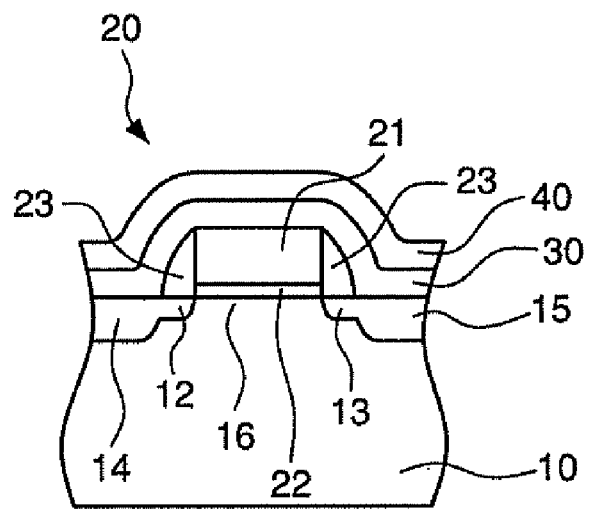

In FIG. 1C, a layer 40 of cobalt (Co) is conformally formed over the substrate 10. The Co layer 40 may also be formed by sputtering or by any other suitable metal deposition technique. The Co layer 40 is typically deposited to a thickness of between about 5 and 10 nanometers.

Figure 1D:
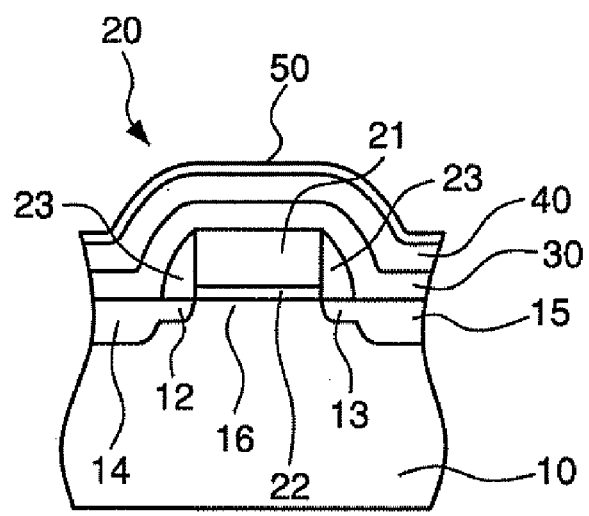

In order to prevent oxidation, a cap layer 50 of titanium nitride (TiN) is conformally formed over the substrate 10 as shown in FIG. 1D. The TN cap layer 50 may be deposited using any conventional deposition technique such as physical vapor deposition or chemical vapor deposition. The TiN cap layer 50 is typically deposited to a thickness of between about 5 and 30 nanometers.

Figure 1E:
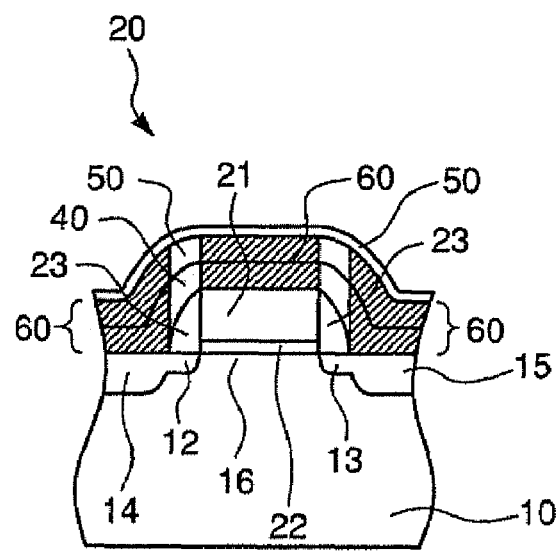

A rapid thermal annealing (RTA) step is now performed on the substrate 10. The RTA may be performed in a rapid thermal process (RTP) system, which provides a fast ramp-up/ramp-down for the anneal process. The RTA may be performed at a temperature of between about 300° C. and 700° C., for a time period of between about 10 and 120 seconds. As shown in FIG. 1E, the RTA step transforms the Ni and Co layers 30, 40 overlying the source 14 and drain 15 regions of the silicon substrate 10 and overlying the polysilicon gate 21 to a bi-silicide film 60 of $CoSi_x$/NiSi. The portions of the Ni and Co, and TiN layers 30, 40, 50 overlying the nitride spacers 23 remain unreacted after RTA.

Figure 1F:
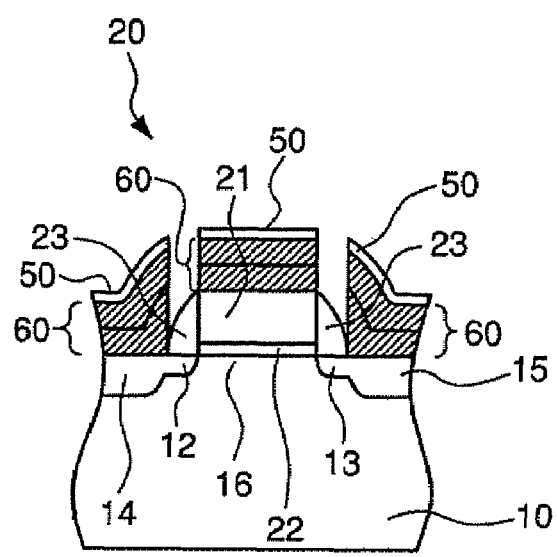

In FIG. 1F, the process is completed by removing unreacted portions of the Ni, Co, and TiN layers 30, 40, 50 from the substrate 10 using any conventional etching process, such as wet etching with a conventional silicide selective etch (SPM) solution, which typically comprises a $H_2SO_4$/$H_2O_2$ (within $H_2O$) mixture. After etching, an optional second RTA step may be performed to control the overall bi-silicide film thickness and the $CoSi_x$/NiSi ratio. The optional RTA step may be performed in the RTP system at a temperature of between about 300° C. and 700° C., for a time period between about 10 and 120 seconds.

Figure 1G:
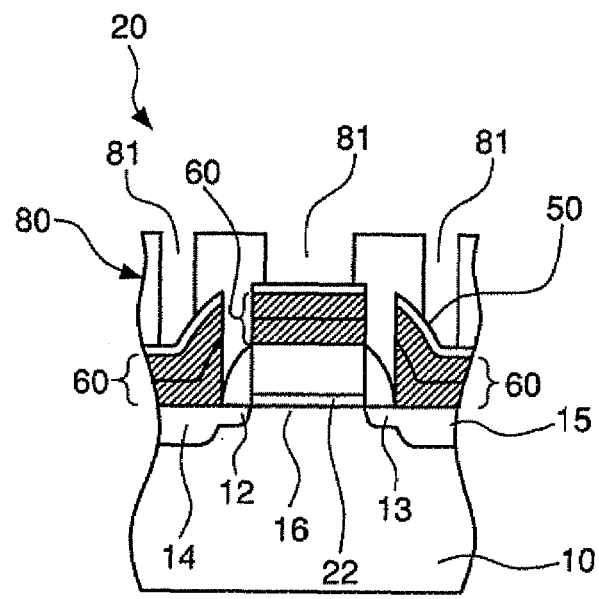

After completing the process of the invention, contacts to the gate 21, and the source 14 and drain 15 regions may be formed using conventional methods. For example, the contacts may be formed by depositing a dielectric layer 80 of over the substrate 10 and etching contact openings 81 in the dielectric layer 80 above the gate 21, and the source 14 and drain 15 regions as shown in FIG. 1G. The contact openings 81 may then be filled with a conductive material 82 to complete the contacts 90 as shown in FIG. 1H.

Figure 1H:
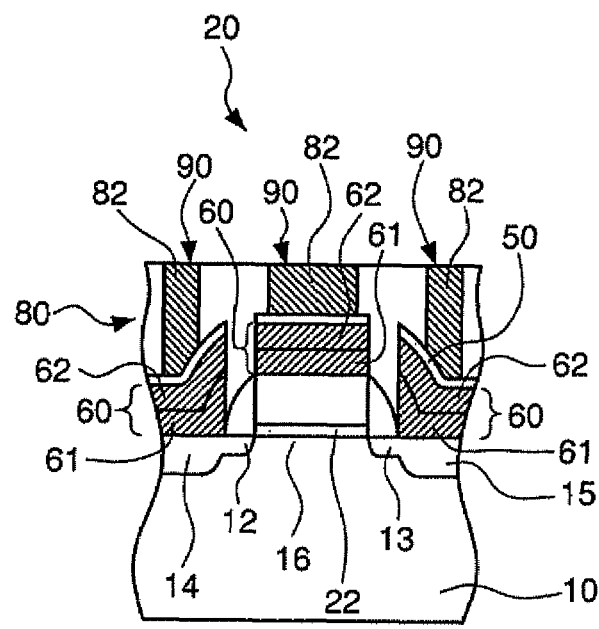

Referring still to FIG. 1H, bi-silicide $CoNiSi_x$ film 60 formed by the process of the invention is comprised of a relatively thinner top $CoSi_x$ portion 61 that is operative as a protection layer and a relatively thicker, low resistance NiSi portion 62 underneath that is operative as gate and source/drain conductive material. The individual thickness of the $CoSi_x$ and NiSi portions 61, 62 can be easily adjusted by altering the Co/Ni sputter ratio and/or the RTA process, to meet the required function of different high performance IC products.

EXPERIMENTAL RESULTS AND DISCUSSION

Figures 2, 3:
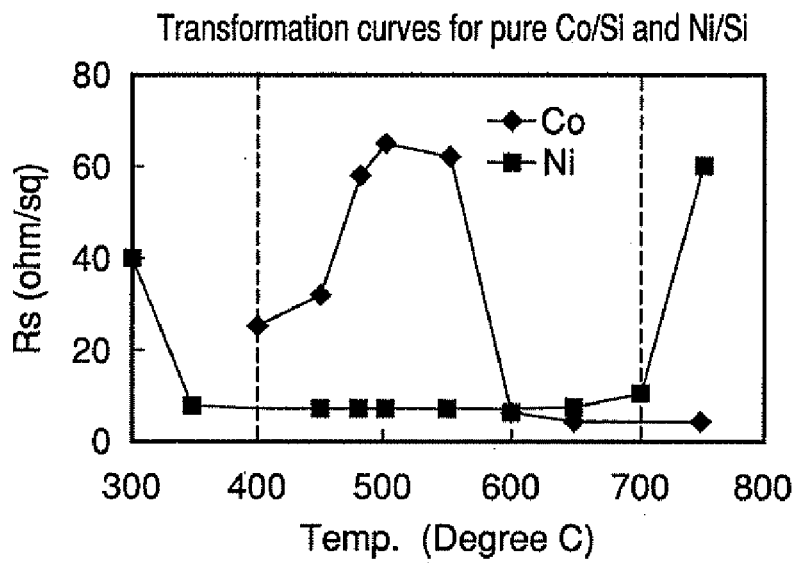
FIG. 2 a graph plotting phase transformation curves (RTA temperature versus sheet resistance Rs) for pure Co/Si and pure Ni/Si.
FIG. 3 is a table comparing the sheet resistance of pure NiSi films and bi-silicide $CoSi_x$/NiSi films.

Referring to FIG. 2, there is shown a graph plotting phase transformation curves (RTA temperature versus sheet resistance Rs) for pure Co/Si and pure Ni/Si. The RTA temperatures to maintain low sheet resistance were selected in the range of 300° C. to 700° C. Within this temperature range, $NiSi_2$ with a high Rs does not form. Also with this temperature range, $CoSi_x$ does not agglomerate, but does have a high Rs similar to that of $Co_2Si$ or CoSi, which might increase the overall Rs of the bi-layer silicide ($CoNiSi_x$). Hence, the ratio of $CoSi_x$/NiSi in the bi-silicide film of the invention is very critical and should be carefully controlled to form the thinner $CoSi_x$ portion at the top of the film.

In accordance with the optimized RTA process and Co/Ni thickness ratio of the invention, the Rs of the bi-silicide $CoSi_x$/NiSi film of the invention can be lower than that of the pure NiSi process as shown in the Table of FIG. 3.

Figure 4:
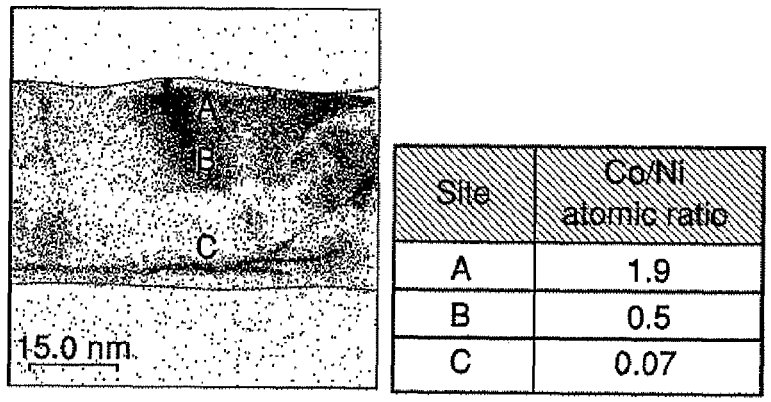
FIG. 4 shows a TEM and EDX analysis of films made according to the Co/Ni bi-layer silicide process of the invention.
Figure 5:
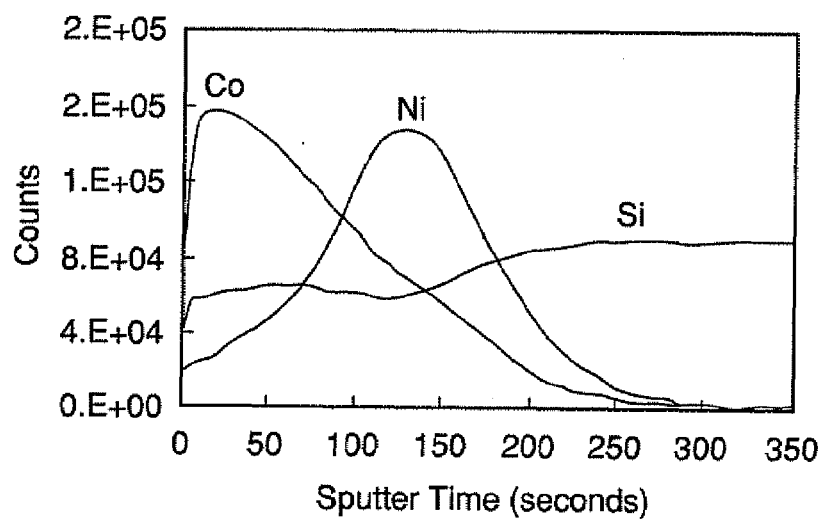
FIG. 5 is an Auger depth profile of a bi-silicide $CoSi_x$/NiSi film made according to the invention.

As shown in the X-ray transmission electron microscope (TEM) picture of FIG. 4, the method of the invention only forms one smooth metallic $CoNiSi_x$ silicide film, without any interfacial boundary. An x-ray energy dispersive spectrometer (EDX) analysis shows that Co-rich silicide is at the top of the film and forms approximately 15% of the overall thickness of the film. The EDX analysis shows that the bottom of the film is substantially pure NiSi. The depth profile analysis obtained with Auger electron spectroscopy (AES), as shown in FIG. 5, reconfirms the composition distribution of the bi-silicide $CoNiSi_x$ film of the invention, showing a high Co concentration at the top of the film.

Figures 6, 7:
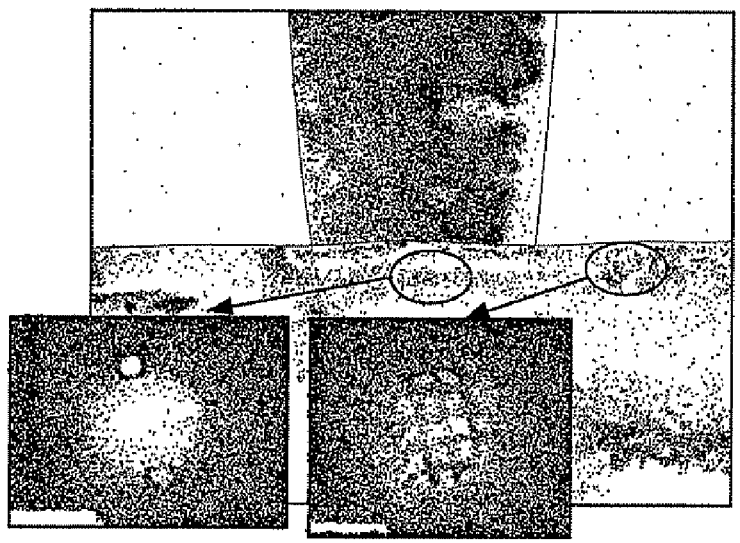
FIG. 6 is a table comparing chemical resistance for Co, Ni and metal silicides.
FIG. 7 shows a TEM and diffraction pattern analysis for pure a NiSi film under a contact hole with made with a conventional backend $CoSi_2$ process.

Chemical acids such as $H_xSO_4$, $H_3PO_4$, and HCl have been tested and data shows a high etching rate on Co and Ni films, but low degradation on silicide films. The etching selectivity of silicide films such as $CoSi_x$, NiSi, and $CoNiSi_x$, and metal films such as Co and Ni, according to the Rs variation percentage after chemical attack, have been examined to be greater than 200 (see the Table of FIG. 6). This indicates that silicide films such as $CoSi_x$, NiSi, and $CoNiSi_x$ show excellent chemical resistance to the chemical acids listed above.

On the other hand for plasma stability, a X-ray photoelectron study (XPS) shows that a pure NiSi film is easily attacked by plasma, as the Fluorine gas used in the plasma process (i.e., etch process) forms a Ni—F bond. Further, a chain reaction among a NiSi film, $F_2$ and $O_2$ destroys the NiSi film integrity and dramatically increases the Rs. An amorphous-like layer is formed on the damaged region as shown by the X-ray TEM picture of FIG. 7. This phenomena implies that the pure NiSi film exhibits poor plasma stability which would be an issue in manufacturing for a post salicide process similar to a CoSi$_2$ process.

Figure 8:
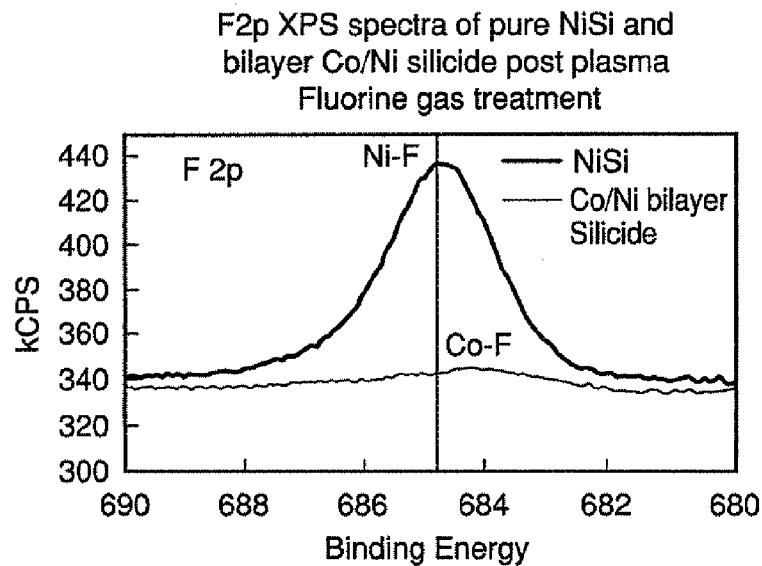
FIG. 8 shows a F2p XPS spectra of a pure NiSi film and a bi-silicide $CoSi_x$/NiSi film made according to the invention post plasma Fluorine gas treatment.
Figure 9:
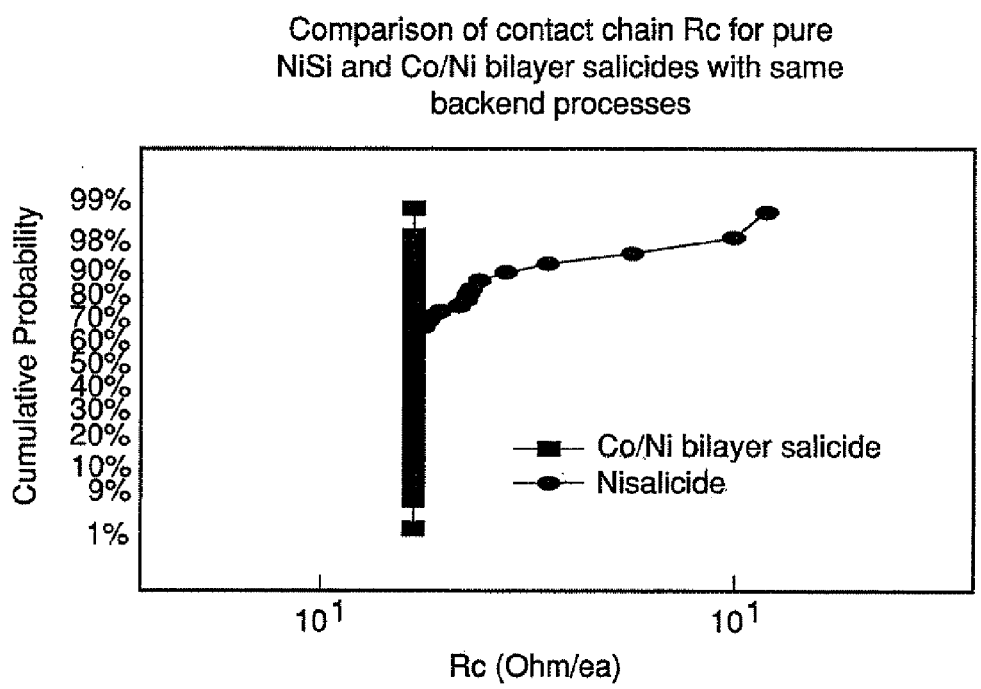
FIG. 9 is a graph comparing the contact chain for a pure NiSi film to a bi-silicide $CoSi_x$/NiSi film made according to the invention.

The CoNiSi$_x$ film produced by the Co/Ni bi-layer silicide process of the invention was treated with the same plasma and Fluorine gas, and showed significantly reduced Ni—F (or Co—F) bonding signal intensity, which provided the CoNiSi$_x$ film of the invention with very good plasma resistance as shown in FIG. 8. Electrical performance on contact resistance by using the bi-layer Co/Ni silicide process of the invention also shows no failure site, which is much better than with the pure NiSi process as shown in FIG. 9.

Figure 10A:
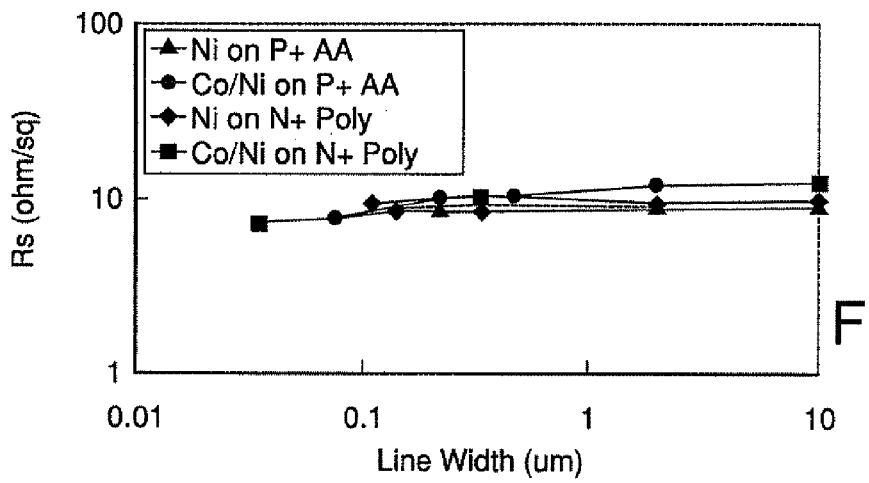
FIGS. 10A-10C are graphs comparing the sheet resistance (FIG. 10A), junction leakage (FIG. 10B), and isolation (FIG. 10C), of films made according to the Co/Ni bi-layer silicide process of the invention and of films made according to a conventional NiSi process.
Figure 10B:
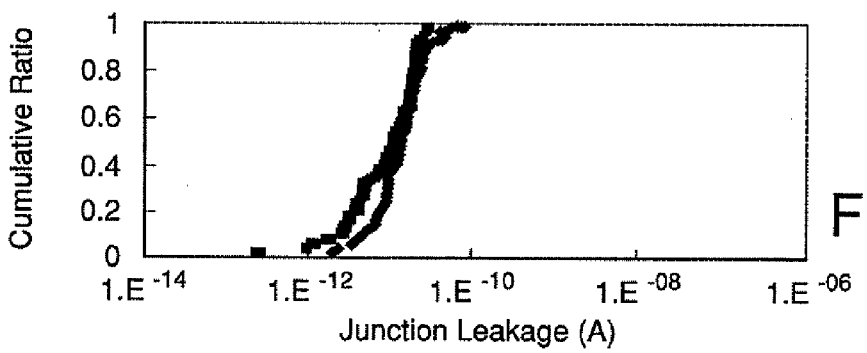
Figure 10C:
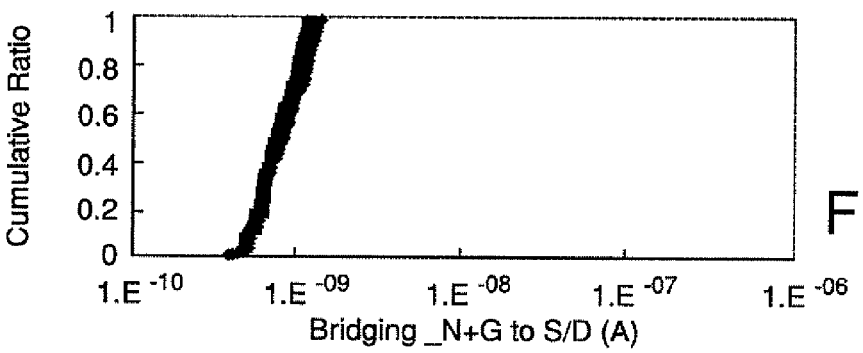
Figure 11:
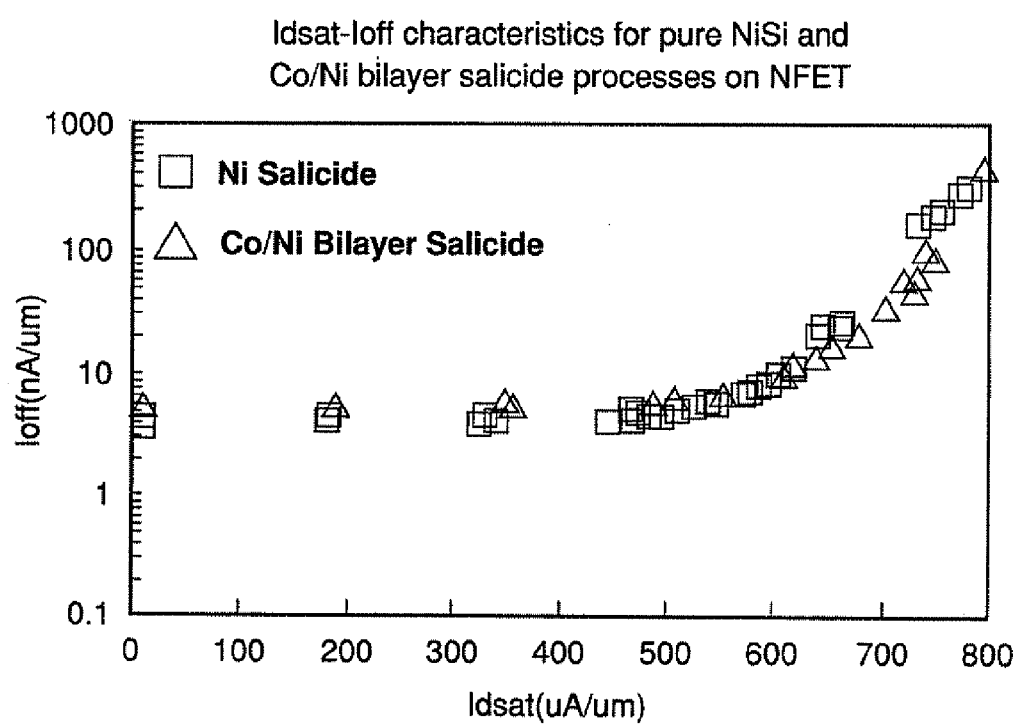
FIG. 11 shows the Idsat/Ioff characteristics for films made according to the bi-layer Co/Ni silicide process of the invention and films made according to a conventional NiSi silicide process on a NFET.

As mentioned earlier, compared to the CoSi$_2$ process, the NiSi process has a lower Rs without agglomeration, which may allow gates to shrink down to 20 nanometers and below, and better junction leakage performance is due to less Si consumption. Furthermore, the NiSi process of less thermal budget, provides about an 8% improvement over the CoSi$_2$ process on both NFET and PFET Idsat/Ioff (100 nA). Films made according to the Co/Ni bi-layer silicide process of the invention exhibit no degradation in terms of the Rs (FIG. 10A), junction leakage (FIG. 10B), and isolation (FIG. 10C), which occurs in films made according to a conventional NiSi process. In addition, FIG. 11 shows that the NFET Idsat/Ioff (100 nA) for films made according to the bi-layer Co/Ni silicide process of the invention measured 680 μA, which is an additional 5% gain over films made according to a conventional NiSi silicide process (640 μA). It is suspected that the reason for this improvement might be lower R$_{SD}$ (source or drain R value) which is due to silicide lateral diffusion in the source/drain area. Moreover, no degradation was observed on PFET performance for the Co/Ni bi-layer silicide process of the invention.

While the foregoing invention has been described with reference to the above embodiments, various modifications and changes can be made without departing from the spirit of the invention. Accordingly, all such modifications and changes are considered to be within the scope of the appended claims.

What is claimed is:

1. A semiconductor device comprising:
   a gate;
   source/drain regions formed on opposite sides of the gate; and
   bi-silicide films formed over the gate and the source/drain regions, each of the bi-silicide films including a cobalt-rich portion and a nickel-rich portion, the cobalt-rich portion on a top of the nickel-rich portion,
   wherein the cobalt-rich portion is thinner than the nickel-rich portion.

* * * * *

UNITED STATES PATENT AND TRADEMARK OFFICE
CERTIFICATE OF CORRECTION

PATENT NO. : 7,247,915 B2  Page 1 of 1
APPLICATION NO. : 11/375778
DATED : July 24, 2007
INVENTOR(S) : Chih-Wei Chang et al.

It is certified that error appears in the above-identified patent and that said Letters Patent is hereby corrected as shown below:

Column 1, line 22, delete "modem" and insert therefore -- modern -- .

Column 3, line 38, delete "TN" and insert therefore -- TIN -- .

Signed and Sealed this

Twenty-seventh Day of November, 2007

JON W. DUDAS
*Director of the United States Patent and Trademark Office*